United States Patent
Lee et al.

(10) Patent No.: US 8,470,500 B2
(45) Date of Patent: Jun. 25, 2013

(54) REFLECTIVE EXTREME ULTRAVIOLET MASK

(75) Inventors: Dong-Gun Lee, Hwaseong-si (KR); Seong-Sue Kim, Seoul (KR); Tae-Geun Kim, Gwangjin-gu (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 170 days.

(21) Appl. No.: 13/069,758

(22) Filed: Mar. 23, 2011

(65) Prior Publication Data

US 2011/0275013 A1     Nov. 10, 2011

(30) Foreign Application Priority Data

May 6, 2010     (KR) .................. 10-2010-0042281

(51) Int. Cl.
*G03F 1/24*     (2012.01)

(52) U.S. Cl.
USPC .............................................. 430/5

(58) Field of Classification Search
USPC .................... 430/5, 30, 394; 378/35
See application file for complete search history.

(56) References Cited

U.S. PATENT DOCUMENTS

| | | | |
|---|---|---|---|
| 6,875,543 B2 | 4/2005 | Chapman et al. | |
| 8,241,821 B2 * | 8/2012 | Ikuta | 430/5 |
| 2005/0100797 A1 * | 5/2005 | Shoki et al. | 430/5 |
| 2009/0191475 A1 * | 7/2009 | Lee et al. | 430/5 |

FOREIGN PATENT DOCUMENTS

| | | |
|---|---|---|
| JP | 2008244089 A | 10/2008 |
| KR | 102009011425 | 11/2009 |

* cited by examiner

*Primary Examiner* — Stephen Rosasco
(74) *Attorney, Agent, or Firm* — Harness, Dickey & Pierce, P.L.C.

(57) ABSTRACT

According to example embodiments, a reflective EUV mask may include a mask substrate, a patterned structure and a non-patterned structure on the mask substrate. At least one of the patterned structure and the non-patterned structure may include a thermally treated region configured to reduce a reflectivity of the respective patterned and non-patterned structure.

7 Claims, 6 Drawing Sheets

REFLECTIVE EXTREME ULTRAVIOLET MASK

REFERENCE TO CROSS-RELATED APPLICATION

This application claims priority under 35 USC §119 to Korean Patent Application No. 2010-42281, filed on May 6, 2010 in the Korean Intellectual Property Office (KIPO), the contents of which are herein incorporated by reference in their entirety.

BACKGROUND

1. Field

Example embodiments relate to a reflective extreme ultraviolet mask and a method of manufacturing the same. More particularly, example embodiments relate to a reflective ultraviolet mask having a reflective layer, and a method of manufacturing the reflective extreme ultraviolet mask.

2. Description of the Related Art

As a design rule of a semiconductor device reduces a wavelength of a light used in an exposing process also reduces. Thus, a minute pattern may not be formed using a light such as an Mine, a G-line, a KrF, an ArF, or the like. Therefore, an extreme ultraviolet (EUV) light having a short wavelength may be used in the exposing process.

However, because the light may have high energy, most of the EUV light may be absorbed in an absorbing layer of an EUV mask, so that the EUV light may not arrive on a semiconductor substrate. To overcome this drawback, a reflective EUV mask capable of using a reflected EUV may be used.

A conventional EUV mask may include a mask substrate, a reflective layer on the mask substrate and an absorbing layer pattern on the reflective layer. An edge region of the absorbing layer pattern may correspond to a non-patterned region that may not be used in an exposing process. An EUV light reflected from a portion of the reflective layer under the edge region of the absorbing layer pattern may interfere with an EUV light reflected from a portion of the reflective layer under a patterned region of the absorbing layer pattern. Therefore, it may be required to decrease a reflectivity of the portion of the reflective layer under the edge region of the absorbing layer pattern.

In order to decrease the reflectivity of the portion of the reflective layer, the edge region of the absorbing layer pattern and the portion of the reflective layer may be removed by a plasma etching process using a photoresist pattern. Because the portion of the reflective layer may be relatively thick, the portion of the reflective layer may be removed by the several plasma etching processes.

This may cause a long time for manufacturing the reflective EUV mask. Further, because a plurality of the photoresist patterns may be used in the plasma etching processes, byproducts generated from the photoresist patterns may act as critical defects of the reflective EUV mask.

Moreover, a width of the absorbing layer pattern may determine a width of a desired pattern. A width of a portion of the absorbing layer patterns may be different from that of other absorbing layer patterns, so that a portion of the reflective layer under the portion of the absorbing layer pattern may have a reflectivity higher than that of other reflective layers. When a pattern may be formed using this abnormal reflective EUV mask, the pattern may not have a desired shape.

Furthermore, the reflectivity of the reflective layer may not be locally controlled. Thus, the abnormal reflective EUV mask may be discarded. As a result, it may be required to manufacture a new reflective EUV mask.

SUMMARY

According to example embodiments, a reflective extreme ultraviolet (EUV) mask includes a mask substrate, a patterned structure on the mask substrate, and a non-patterned structure on the mask substrate. At least one of the patterned structure and the non-patterned structure include a thermally treated region configured to control a reflectivity of the respective patterned and non-patterned structures.

According to example embodiments, the patterned structure includes a reflective layer on the mask substrate, and an absorbing layer pattern on the reflective layer, the absorbing layer pattern having openings configured to expose the reflective layer.

According to example embodiments, the reflective layer includes a plurality of layers of molybdenum and silicon alternately stacked.

According to example embodiments, the thermally treated region is in at least a portion of the reflective layer exposed through at least one of the openings. The thermally treated region locally control reflectivities of the reflective layer exposed through the at least one opening.

According to example embodiments, the non-patterned structure includes a reflective layer on the mask substrate, and an absorbing layer on the reflective layer. At least a portion of the thermally treated region is in a vertical direction in the absorbing layer and the reflective layer.

According to example embodiments, the patterned structure is centrally located on the mask substrate and the non-patterned structure is located at an edge portion of the mask substrate surrounding the patterned structure.

According to example embodiments, a width of the opening including the thermally treated region is wider than a width of an opening not including a thermally treated region.

According to example embodiments, a method of manufacturing a reflective EUV mask includes forming a reflective layer on a mask substrate, forming an absorbing layer having a patterned portion and a non-patterned portion on the reflective layer, and thermally treating the reflective layer under at least one of the patterned portion and the non-patterned portion of the absorbing layer to control a reflectivity of the reflective layer.

According to example embodiments, thermally treating the reflective layer comprises irradiating a laser on the reflective layer.

According to example embodiments, the method further includes forming the reflective layer by alternately stacking layers of molybdenum and silicon.

According to example embodiments, the method further includes forming the absorbing layer including a plurality of openings in the patterned portion, the plurality of openings exposing the reflective layer, and thermally treating the reflective layer exposed through at least one of the openings, wherein a width of an opening exposing the thermally treated reflective layer is wider than a width of an opening not exposing a thermally treated reflective layer.

According to example embodiments, a method of manufacturing a thermally treated mask includes forming a reflective layer on a mask substrate, forming an absorbing layer on the reflective layer, patterning at least a portion of the absorbing layer, and thermally treating the reflective layer.

According to example embodiments, the method further includes thermally treating the reflective layer under the patterned portion of the absorbing layer.

According to example embodiments, the method further includes forming the reflective layer by alternately stacking layers of molybdenum and silicon.

According to example embodiments, the method further includes patterning the absorbing layer to create a plurality of openings to expose the reflective layer, and thermally treating the exposed reflective layer.

According to example embodiments, thermally treating the reflective layer comprises irradiating a laser on the reflective layer.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, example embodiments will be explained in detail with reference to the accompanying drawings.

Reflective EUV Mask

Figure 1:
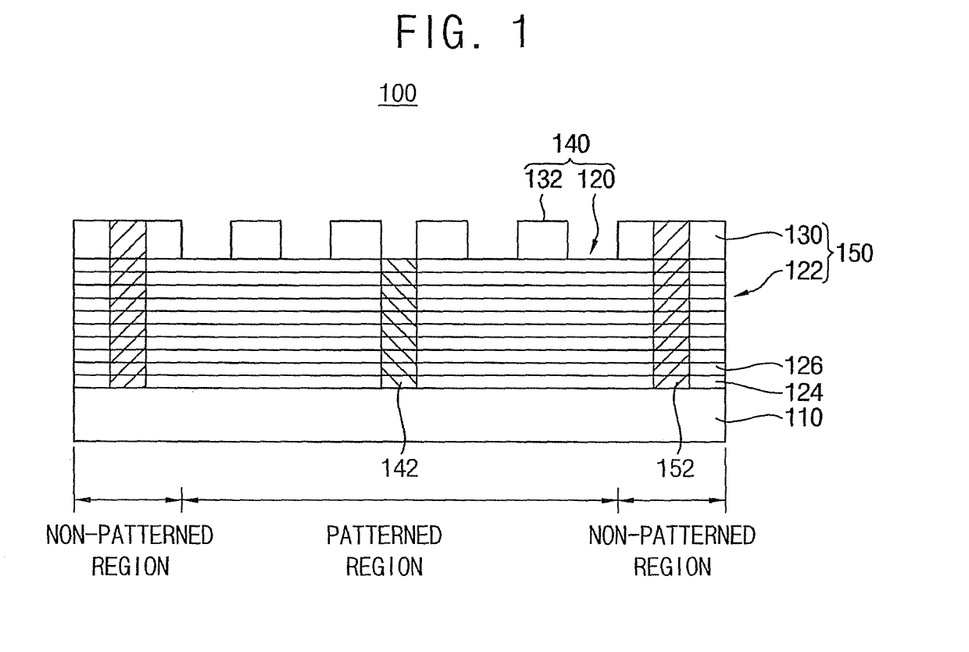
FIG. 1 is a cross-sectional view illustrating a reflective EUV mask in according to example embodiments.

FIG. 1 is a cross-sectional view illustrating a reflective EUV mask according to example embodiments.

Referring to FIG. 1, a reflective EUV mask 100 according to example embodiments may include a mask substrate 110, a patterned structure 140 and a non-patterned structure 150.

The mask substrate 110 may include a patterned region and a non-patterned region. In some example embodiments, the mask substrate 110 may have a rectangular shape. The patterned region may be located at a central portion of the mask substrate 110. The non-patterned region may be located at an edge portion of the mask substrate 110 to surround the patterned region.

The patterned structure 140 may be arranged on the patterned region of the mask substrate 110. The patterned structure 140 may include a reflective layer 120 and an absorbing layer pattern 132.

In example embodiments, the reflective layer 120 may be arranged on the mask substrate 110. The reflective layer 120 may include molybdenum layers 124 and silicon layers 126 alternately stacked. The reflective layer 120 may reflect an EUV light irradiated on the EUV mask 100 in an exposing process.

The absorbing layer pattern 132 may be arranged on the reflective layer 120. The absorbing layer pattern 132 may have openings configured to expose an upper surface of the reflective layer 120. Thus, the EUV light irradiated on the EUV mask 100 may be incident to the reflective layer 120 through the openings of the absorbing layer pattern 132.

In example embodiments, a width of each of the openings in the absorbing layer pattern 132 may determine a shape of a desired pattern obtained by the exposing process. The openings of the absorbing layer pattern 132 may have a uniform width. However, when a width of an opening is wider than widths of other openings, a portion of the reflective layer 120 exposed through the wide opening may have a reflectivity higher than that of a portion of the reflective layer 120 exposed through a narrow opening. The pattern may not have a desired shape using the EUV mask having the above-mentioned structure.

Therefore, when the EUV mask having the above-mentioned structure used, it may be required to decrease the reflectivity of the portion of the reflective layer 120 exposed through the wide opening. The portion of the reflective layer 120 exposed through the wide opening may have a thermally treated region 142.

In example embodiments, a laser may be irradiated on the portion of the reflective layer 120 exposed through the wide opening to increase a temperature of the portion of the reflective layer 120 in a short time, thereby expanding the portion of the reflective layer 120. A single dose of laser irradiation may be sufficient. After the laser irradiation is stopped, the portion of the reflective layer 120 may be cooled, the rapidly expanded portion of the reflective layer 120 may contracted. Periodicity between the expanded and cooled portion of the reflective layer 120, (the thermally treated region 142) may be disturbed, and the thermally treated region 142 may have a low reflectivity. As a result, the reflectivity of the thermally treated region 142 may be substantially the same as that of other portions of the reflective layer 120. In order to provide the thermally treated region 142 and the other portions of the reflective layer 120 with the same reflectivity, it may be required to properly control energy of the laser.

The non-patterned structure 150 may be arranged on the non-patterned region of the mask substrate 110. The non-patterned structure 150 may include a reflective layer 122 and an absorbing layer 130. In example embodiments, the reflective layer 122 of the non-patterned structure 150 may be substantially the same as the reflective layer 120 of the patterned structure 140. Thus, any further illustrations/explanations with respect to the reflective layer 122 of the non-patterned structure 150 will be omitted herein for brevity. The absorbing layer 130 may be arranged on the reflective layer 122. The absorbing layer 130 in the non-patterned region may not be used in the exposing process. Thus, the absorbing layer 130 may not have openings for exposing the reflective layer 122.

In example embodiments, although the reflective layer 122 may not be exposed, the EUV light may be partially reflected from the reflective layer 122. The EUV light reflected from the non-patterned region may interfere with the EUV light reflected from the patterned region. Therefore, it may be required to provide a reflectivity of the reflective layer 122 in the non-patterned region of about zero.

The reflective layer 122 may have a thermally treated region 152. The thermally treated region 152 in the non-patterned region may be formed by processes substantially the same as those for forming the thermally treated region 142 in the patterned region. Thus, any further illustrations/explanations with respect to the thermally treated region 152 in the non-patterned region will be omitted herein for brevity. Here, as mentioned above, because the thermally treated region 152 in the non-patterned region may have a reflectivity of about zero, it may be required to use a laser having energy higher than that of the laser used for forming the thermally treated region 142 in the patterned region.

According to example embodiments, the reflective layer in the non-patterned region may be provided with a desired reflectivity by the simple thermal treatment instead of several plasma etching processes. Thus, a long manufacture time and defect generations caused by the several plasma etching processes may be reduced. Further, the reflectivity of the reflective layer in the patterned region may be locally controlled, so that a desired pattern may be formed using a reflective EUV mask having a partially structural abnormal pattern.

Method of Manufacturing a Reflective EUV Mask

Figure 6:
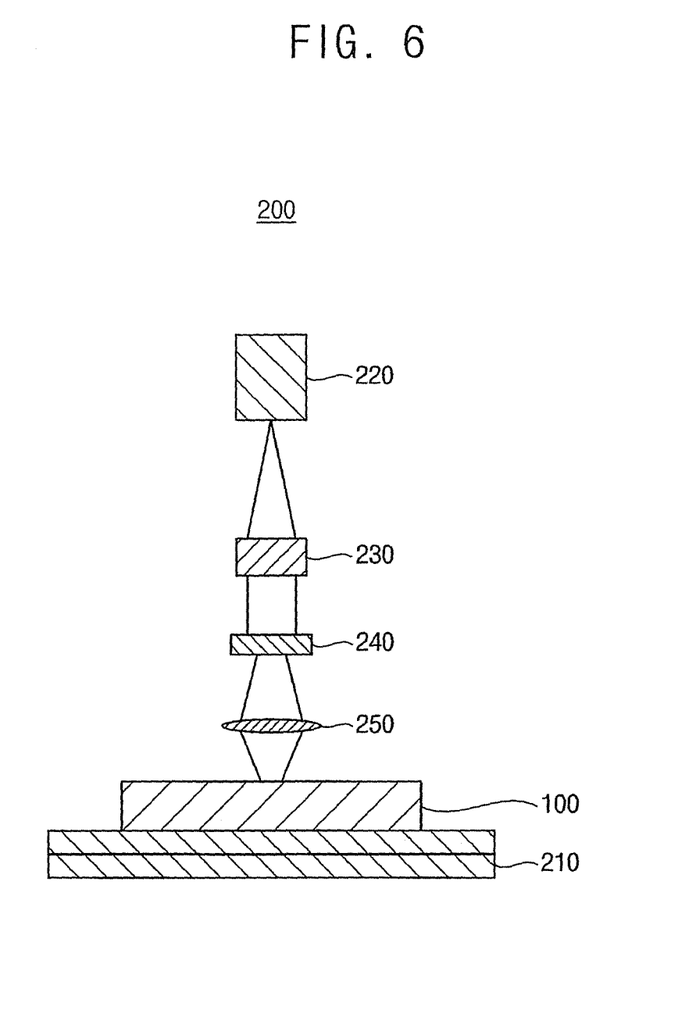
FIG. 6 is a block diagram illustrating a laser irradiator used for forming a thermally treated region in the EUV mask in FIG. 1, according to example embodiments.
Figure 7:
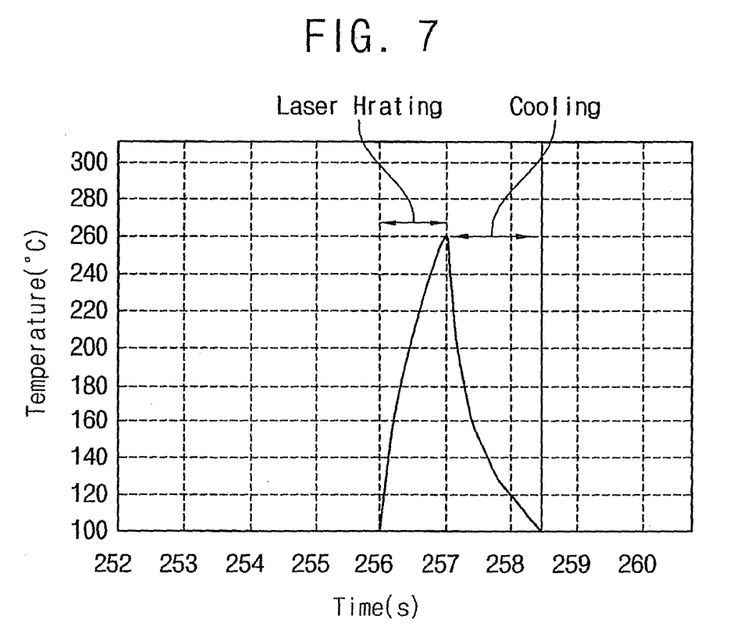
FIG. 7 is a graph showing a temperature change of the thermally treated region in a non-patterned region of the reflective EUV mask in FIG. 1.
Figure 8:
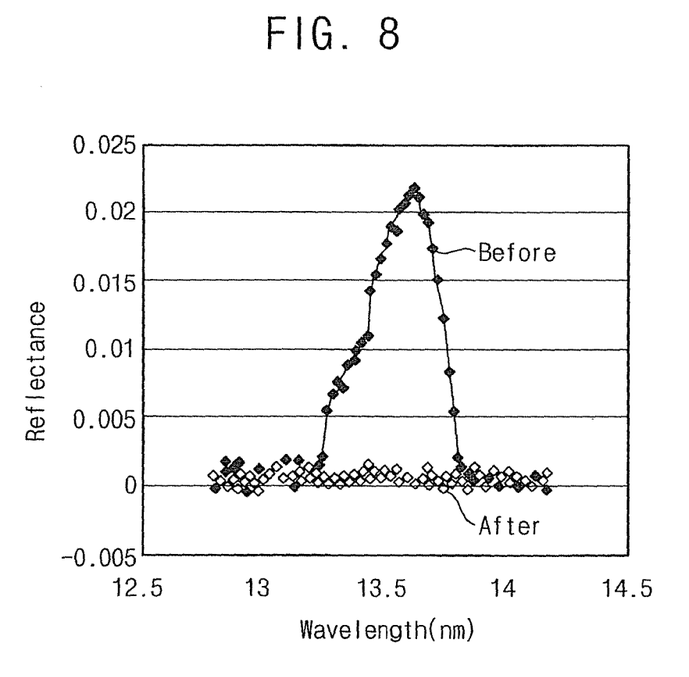
FIG. 8 is a graph showing a reflectivity change of the thermally treated region in a non-patterned region of the reflective EUV mask in FIG. 1.
Figure 9:
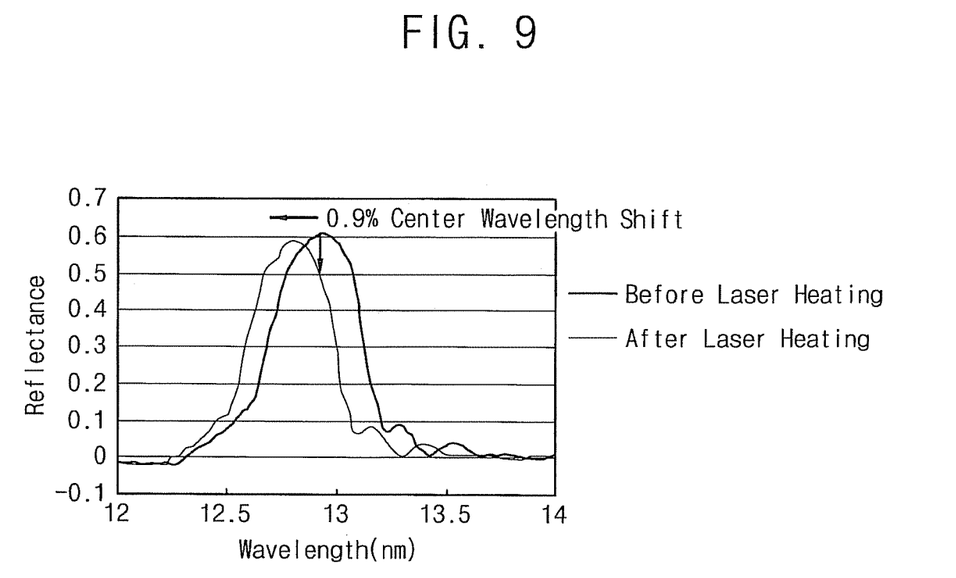
FIG. 9 is a graph showing a reflectivity change of the thermally treated region in a patterned region of the reflective EUV mask in FIG. 1.

FIGS. 2 to 5 are cross-sectional views illustrating a method of manufacturing the reflective EUV mask in FIG. 1, according to example embodiments. FIG. 6 is a block diagram illustrating a laser irradiator used for forming a thermally treated region in the EUV mask in FIG. 1. FIG. 7 is a graph showing a temperature change of the thermally treated region in a non-patterned region of the reflective EUV mask in FIG. 1. FIG. 8 is a graph showing a reflectivity change of the thermally treated region in a non-patterned region of the reflective EUV mask in FIG. 1. FIG. 9 is a graph showing a reflectivity change of the thermally treated region in a patterned region of the reflective EUV mask in FIG. 1.

Figure 2:
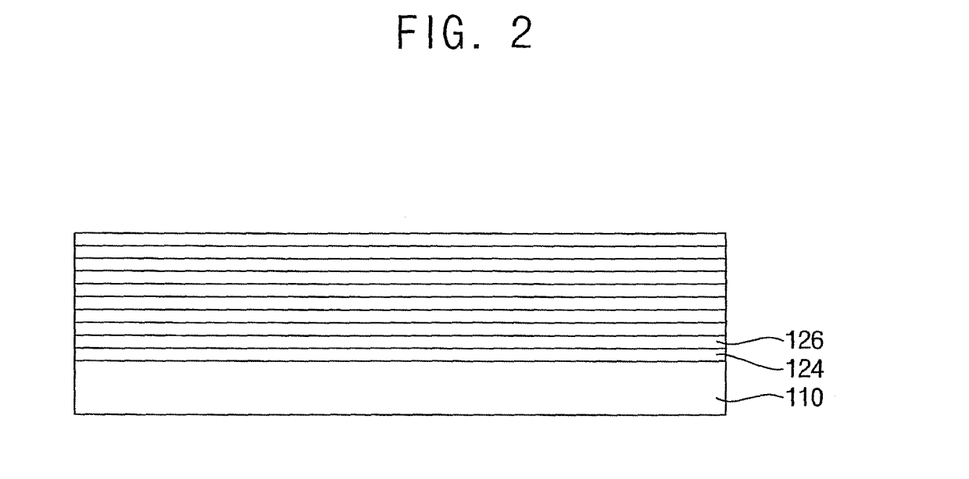
FIGS. 2 to 5 are cross-sectional views illustrating a method of manufacturing the reflective EUV mask in FIG. 1, according to example embodiments.

Referring to FIG. 2, a reflective layer 120 and 122 may be formed on a mask substrate 110. In example embodiments, the mask substrate 110 may have a patterned region and a non-patterned region. The patterned region may be located at a central portion of the mask substrate 110. The non-patterned region may be located at an edge portion of the mask substrate 110 to surround the patterned region. The reflective layer 120 may be positioned over the patterned region of the mask substrate 110. The reflective layer 122 may be positioned over the non-patterned region of the mask substrate 110.

In example embodiments, the reflective layer 120 and 122 may include molybdenum layers 124 and silicon layers 126 alternately stacked. Alternatively, the reflective layer 120 and 122 may include other suitable layers in place of the molybdenum layers 124 and the silicon layers 126.

Figure 3:
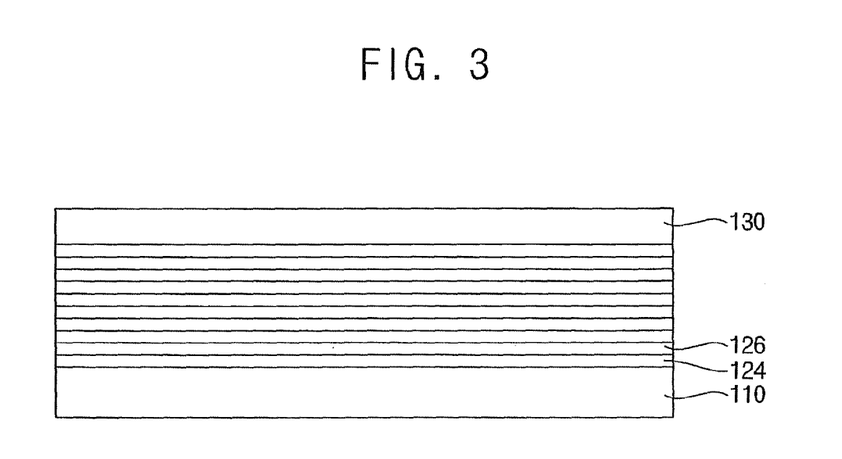

Referring to FIG. 3, an absorbing layer 130 may be aimed on the reflective layer 120 and 122. The absorbing layer 130 may be located over the patterned region and the non-patterned region of the mask substrate 110.

Figure 4:
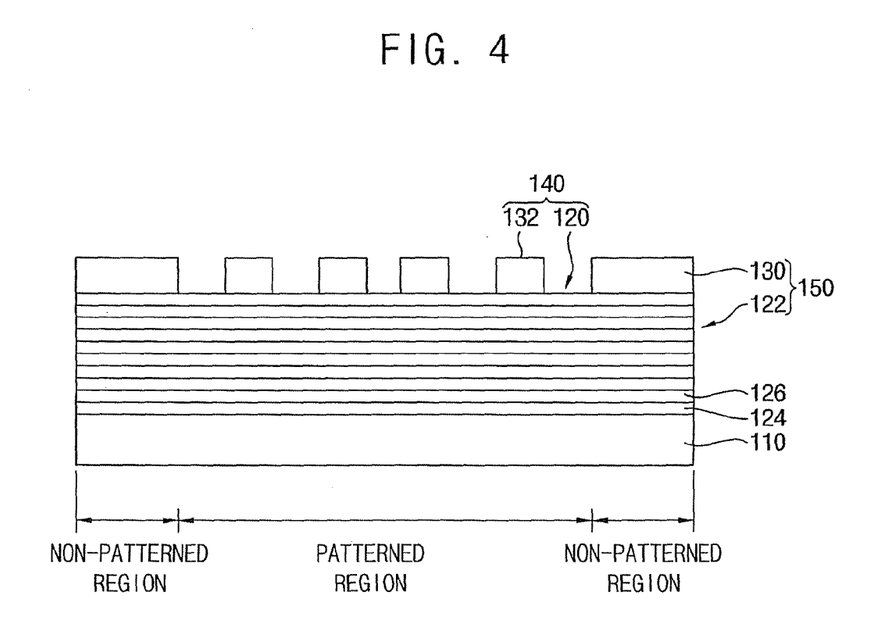

Referring to FIG. 4, the absorbing layer 130 on the patterned region may be patterned to form an absorbing layer pattern 132. The absorbing layer pattern 132 may have openings configured to expose an upper surface of the reflective layer 120 in the patterned region.

Figure 5:
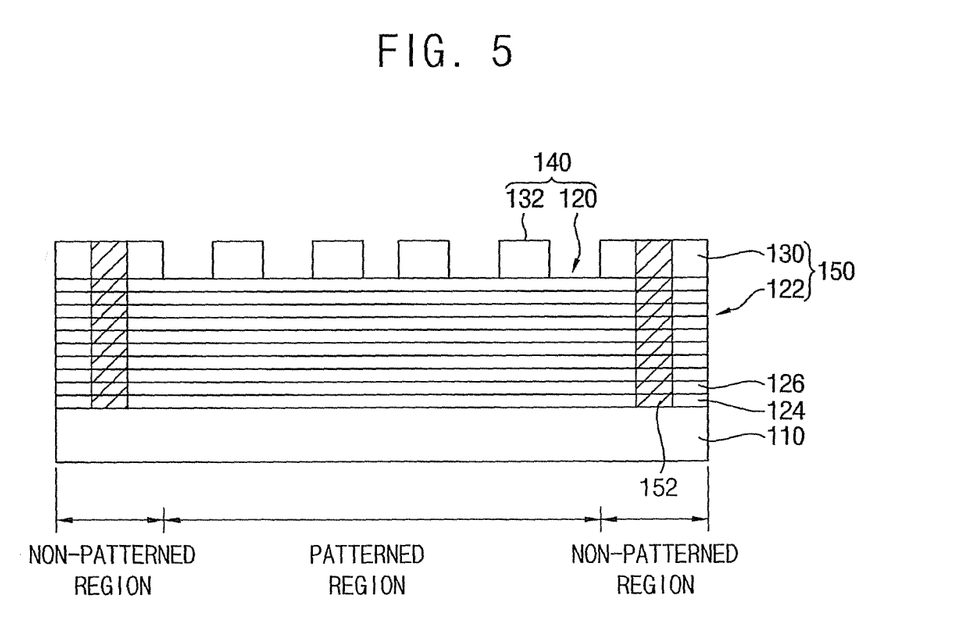

Referring to FIG. 5, a laser may be irradiated on the non-patterned region to form a thermally treated region 152 in the reflective layer 122 of the non-patterned region. In example embodiments, the laser may be irradiated on the reflective layer 122 in the non-patterned region using a laser irradiator 200 of FIG. 6

Referring to FIG. 6, the laser irradiator 200 may include a stage 210 configured to receive the EUV mask 100, a laser source 220 arranged over the stage 210, a collimator lens 230, a beam shaping lens 240 and/or a focusing lens 250 sequentially arranged between the laser source 220 and the stage 210.

Referring to FIG. 7, the laser generated from the laser irradiator 200 may be irradiated on the reflective layer 122 in the non-patterned to increase a temperature of the reflective layer 122 in a relatively short time, thereby expanding the reflective layer 122 in the non-patterned region. A single dose of the laser may be sufficient. When the laser irradiation is stopped, the reflective layer 122 in the non-patterned region may cool and the rapidly expanded reflective layer 122 in the non-patterned region may contract.

Referring to FIG. 8, periodicity in the expanded and cooled reflective layer 122 (the thermally treated region 152) may be disturbed, so that the thermally treated region 152 may have a reflectivity of about zero. Therefore, the EUV light may not be reflected from the non-patterned region, of EUV light irradiated on the non-patterned region may not interfere with the EUV light irradiated on the patterned region.

In example embodiments, a width of each opening in the absorbing layer pattern 132 may determine a shape of a desired pattern formed by the exposing process. Thus, it may be required to provide the openings of the absorbing layer pattern 132 with a uniform width. However, when a width of an opening is wider than widths of other openings, a portion of the reflective layer 120 exposed through the wide opening may have a reflectivity higher than that of a portion of the reflective layer 120 exposed through a narrow opening. The pattern formed may not have a desired shape using the EUV mask having the above-mentioned structure. Therefore, when the EUV mask having the above-mentioned structure is used, it may be required to decrease the reflectivity of the portion of the reflective layer 120 exposed through the wide opening.

In example embodiments, a laser generated from the laser irradiator 200 may be irradiated on the reflective layer 120 in the patterned region to increase a temperature of the portion of the reflective layer 120 in a relatively short time, thereby expanding the reflective layer 120 in the patterned region. A single dose of the laser may be sufficient. When the laser irradiation is stopped, the reflective layer 120 in the patterned region may cool and the rapidly expanded reflective layer 120 in the patterned region may be contracts to produce the EUV mask 100 in FIG. 1.

Referring to FIG. 9, periodicity of the expanded and cooled reflective layer 120 (the thermally treated region 142) may be disturbed, so that the thermally treated region 142 may have a low reflectivity. That is, a center wavelength of the thermally treated region 142 may be shifted toward a short wavelength direction to decrease the reflectivity. Here, the center wavelength may correspond to a wavelength of a maximum reflectivity of the reflective layer 120 as stored in an exposing apparatus. Because the exposing apparatus may store the center wavelength of the reflective layer 120 as a reference wavelength, the reflective layer 120 in the patterned region may be decreased by shifting the center wavelength of the thermally treated region 142. As a result, the thermally treated region 142 may have a reflectivity substantially the same as that of other portions of the reflective layer 120. In order to provide the thermally treated region 142 and the other portions of the reflective layer 120 with the same reflectivity, it may be required to properly control energy of the laser.

According to example embodiments, the reflective layer in the non-patterned region may be provided with a desired reflectivity by the simple thermal treatment instead of several plasma etching processes. Thus, a long manufacture time and defect generations caused by the several plasma etching processes may be reduced. Further, the reflectivity of the reflective layer in the patterned region may be locally controlled, so that a desired pattern may be formed using a reflective EUV mask having a partially structural abnormal pattern.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A reflective extreme ultraviolet (EUV) mask comprising:
   a mask substrate;
   a patterned structure on the mask substrate; and
   a non-patterned structure on the mask substrate,
   wherein at least one of the patterned structure and the non-patterned structure include a thermally treated region configured to control a reflectivity of the respective patterned and non-patterned structures.

2. The reflective EUV mask of claim 1, wherein the patterned structure comprises:
   a reflective layer on the mask substrate; and
   an absorbing layer pattern on the reflective layer, the absorbing layer pattern having openings configured to expose the reflective layer.

3. The reflective EUV mask of claim 2, wherein the reflective layer includes a plurality of layers of molybdenum and silicon alternately stacked.

4. The reflective EUV mask of claim 2, wherein the thermally treated region is in at least a portion of the reflective layer exposed through at least one of the openings, the thermally treated region locally controlling reflectivities of the reflective layer exposed through the at least one opening.

5. The reflective EUV mask of claim 1, wherein the non-patterned structure comprises:
   a reflective layer on the mask substrate; and
   an absorbing layer on the reflective layer,
   wherein at least a portion of the thermally treated region is in a vertical direction in the absorbing layer and the reflective layer.

6. The reflective EUV mask of claim 1, wherein the patterned structure is centrally located on the mask substrate and the non-patterned structure is located at an edge portion of the mask substrate surrounding the patterned structure.

7. The reflective EUV mask of claim 4, wherein a width of the opening including the thermally treated region is wider than a width of an opening not including a thermally treated region.

* * * * *